United States Patent
Frohberg et al.

(10) Patent No.: US 7,396,718 B2
(45) Date of Patent: Jul. 8, 2008

(54) TECHNIQUE FOR CREATING DIFFERENT MECHANICAL STRAIN IN DIFFERENT CHANNEL REGIONS BY FORMING AN ETCH STOP LAYER STACK HAVING DIFFERENTLY MODIFIED INTRINSIC STRESS

(75) Inventors: Kai Frohberg, Niederau (DE); Matthias Schaller, Dresden (DE); Joerg Hohage, Dresden (DE); Holger Schuehrer, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 375 days.

(21) Appl. No.: 11/150,635

(22) Filed: Jun. 10, 2005

(65) Prior Publication Data

US 2006/0091471 A1 May 4, 2006

(30) Foreign Application Priority Data

Oct. 29, 2004 (DE) .................... 10 2004 052 578

(51) Int. Cl.
*H01L 21/8238* (2006.01)

(52) U.S. Cl. ................ 438/233; 438/618; 438/761; 257/369; 257/635

(58) Field of Classification Search ............ 438/233, 438/618, 761; 257/369, 635
See application file for complete search history.

(56) References Cited

U.S. PATENT DOCUMENTS

| 6,573,172 B1 | 6/2003 | En et al. ............ 438/626 |
| 7,193,254 B2 * | 3/2007 | Chan et al. ............ 257/274 |
| 2004/0029323 A1 | 2/2004 | Shimizu et al. ............ 438/142 |
| 2004/0075148 A1 | 4/2004 | Kumagai et al. ............ 257/369 |

FOREIGN PATENT DOCUMENTS

DE 102004026149 A1 12/2005

\* cited by examiner

*Primary Examiner*—Carl Whitehead, Jr.
*Assistant Examiner*—Colleen R Rodgers
(74) *Attorney, Agent, or Firm*—Williams, Morgan & Amerson, P.C.

(57) ABSTRACT

A technique is provided that allows the formation of contact etch stop layers having different intrinsic stress for different transistors, while substantially avoiding any device degradation owing to the partial removal of the contact etch stop layer. Hereby, an additional thin etch stop layer is provided prior to the formation of the contact etch stop layers, thereby substantially maintaining the integrity of metal silicide regions, when a portion of an initially deposited contact etch stop layer is removed.

9 Claims, 5 Drawing Sheets

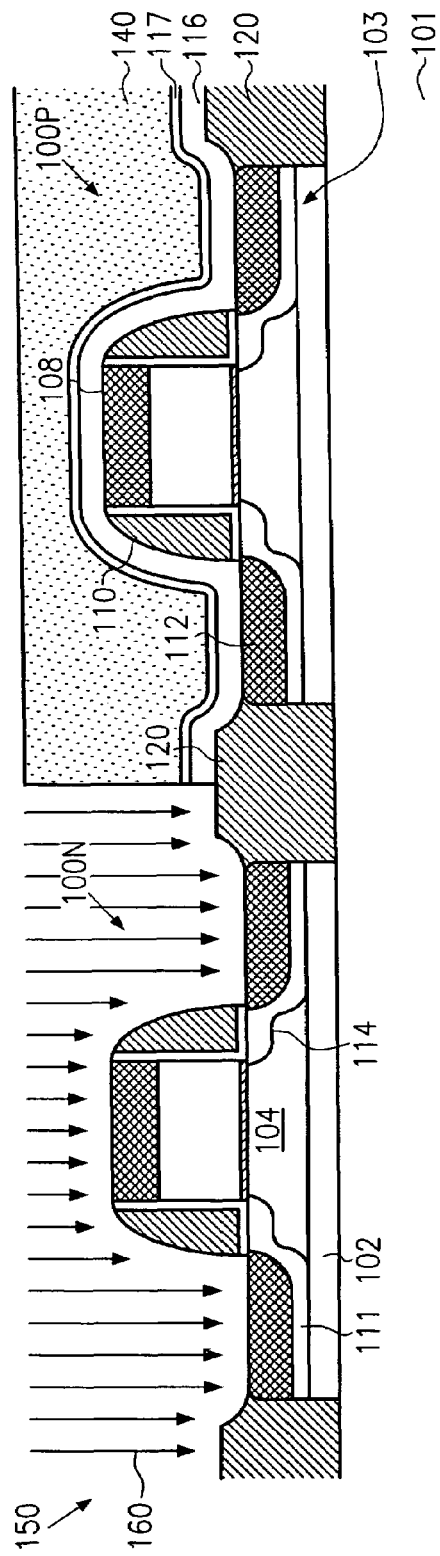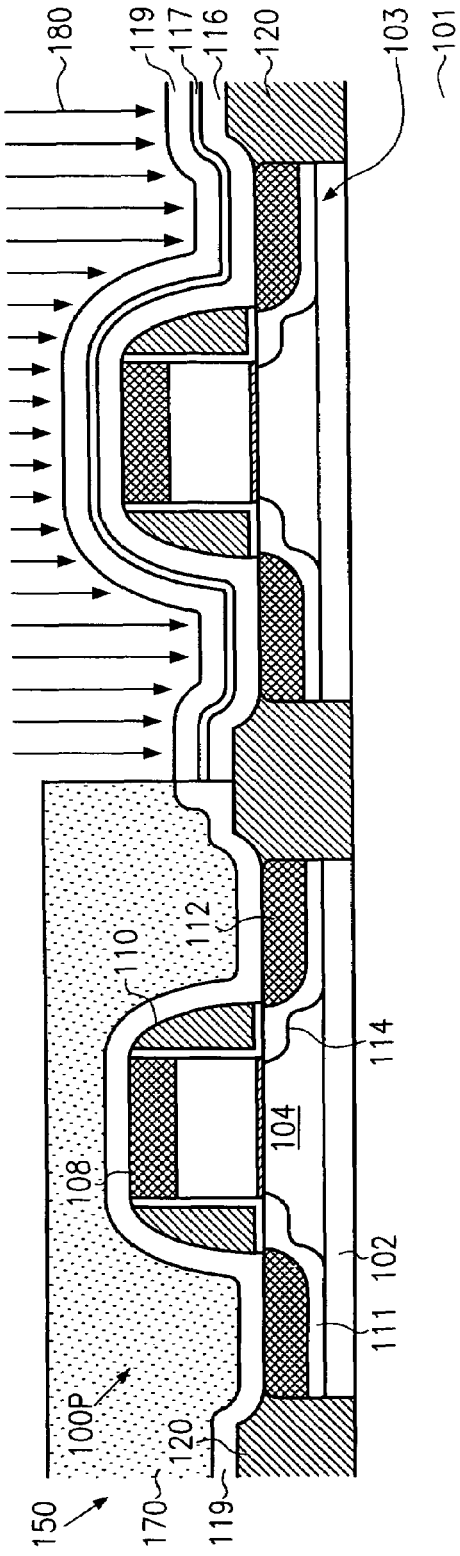
Fig.1c (prior art)
Fig.1d (prior art)

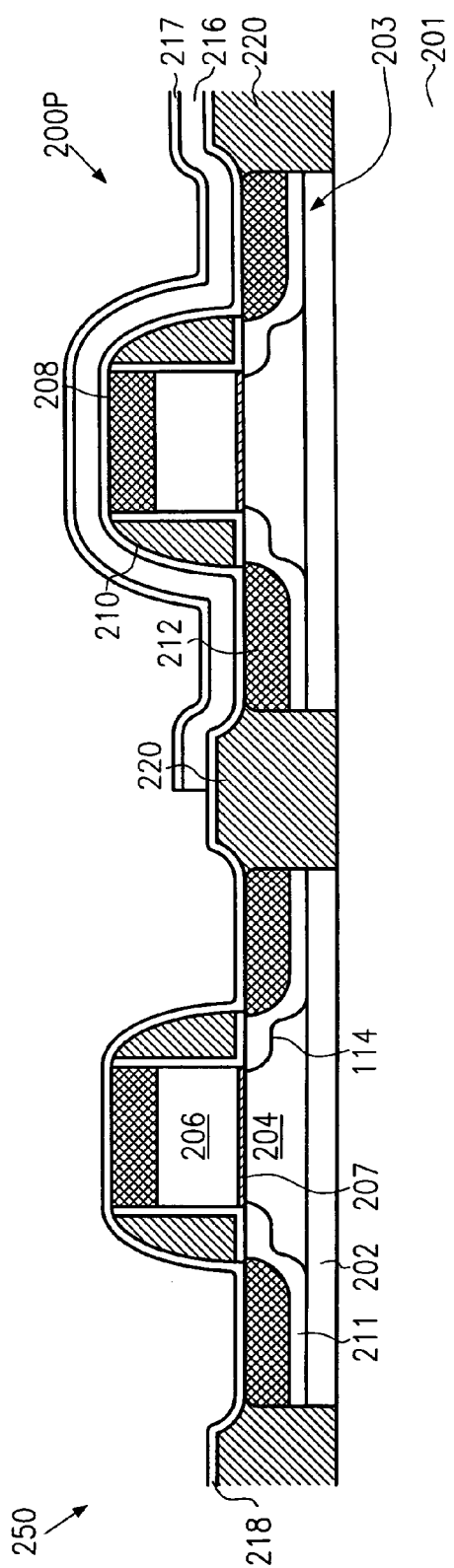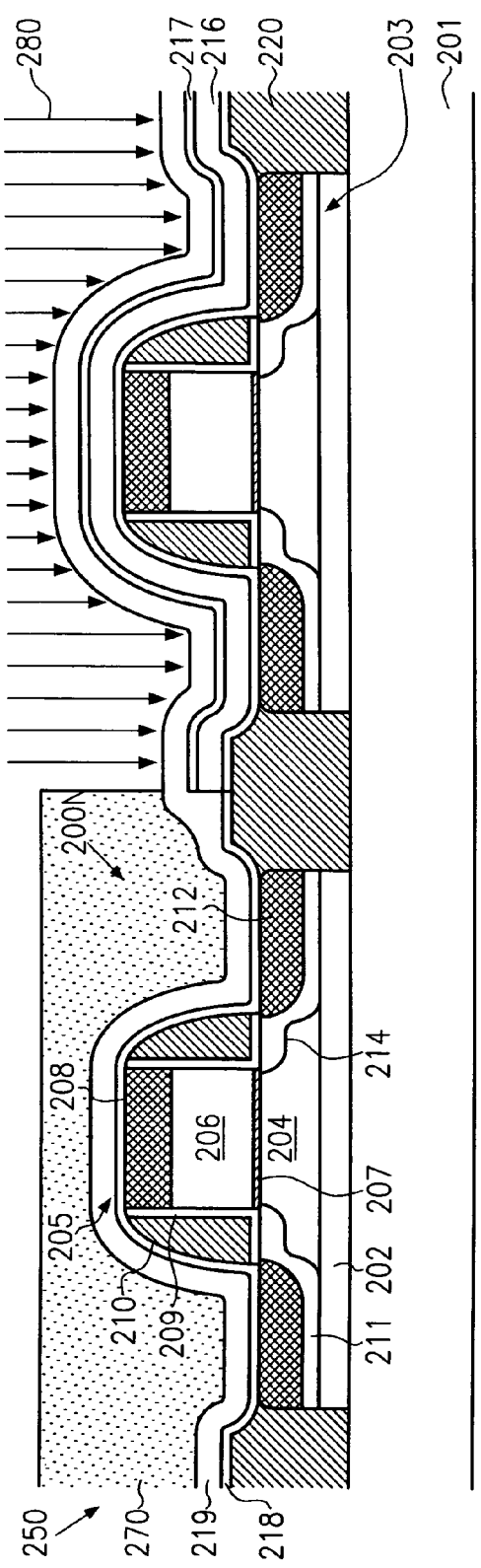
Fig.2c
Fig.2d

TECHNIQUE FOR CREATING DIFFERENT MECHANICAL STRAIN IN DIFFERENT CHANNEL REGIONS BY FORMING AN ETCH STOP LAYER STACK HAVING DIFFERENTLY MODIFIED INTRINSIC STRESS

BACKGROUND OF THE INVENTION

1. Field of the Invention

Generally, the present invention relates to the formation of integrated circuits, and, more particularly, to the formation of field effect transistors having a channel region with a specified intrinsic stress to improve the charge carrier mobility.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with a lightly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, substantially depends on the dopant concentration, the mobility of the charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially influences the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions, however, entails a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control, since reducing the channel length also requires reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Since the continuous size reduction of the critical dimensions, i.e., the gate length of the transistors, necessitates great efforts for the adaptation and possibly the new development of process techniques concerning the above-identified process steps, it has been proposed to also enhance device performance of the transistor elements by increasing the charge carrier mobility in the channel region for a given channel length. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby making a reduction of the dopant concentration a less attractive approach unless other mechanisms are developed to adjust a desired threshold voltage. Second, the lattice structure in the channel region may be modified, for instance by creating tensile or compressive strain, which results in a modified mobility for electrons and holes, respectively. For example, creating tensile strain in the channel region increases the mobility of electrons, wherein, depending on the magnitude of the tensile strain, an increase in mobility of up to 120% may be obtained, which, in turn, may directly translate into a corresponding increase in the conductivity. On the other hand, compressive strain in the channel region may increase the mobility of holes, thereby providing the potential for enhancing the performance of P-type transistors.

Therefore, in some conventional approaches, for instance, a silicon/germanium layer or a silicon/carbon layer is provided in or below the channel region to create tensile or compressive strain therein. Although the transistor performance may be considerably enhanced by the introduction of strain-creating layers in or below the channel region, significant efforts have to be made to implement the formation of corresponding layers into the conventional and well-approved CMOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

In other approaches, stress from an etch stop layer that is required on top of the transistors to control a contact etch process is used to induce strain in the channel regions of the transistors, wherein compressive strain is created in the P-channel transistor, while tensile strain is created in the N-channel transistor. However, this conventional approach, although offering substantial performance advantages, may bring about some drawbacks that may partially offset the benefits accomplished by the enhanced strain engineering, as will be described with reference to FIGS. 1a-1d.

FIG. 1a schematically shows a cross-sectional view of a semiconductor device 150 comprising an NMOS transistor element 100n and a PMOS transistor element 100p. The transistor elements 100n, 100p may be provided in the form of silicon-on-insulator (SOI) devices. Thus, the semiconductor device 150 comprises a silicon substrate 101 having formed thereon an insulating layer 102, such as a buried silicon dioxide layer, followed by a crystalline silicon layer 103. The transistors 100n, 100p may be separated from each other by an isolation structure 120, for instance in the form of a shallow trench isolation. The transistor 100n further comprises a gate electrode structure 105 including a polysilicon portion 106 and a metal silicide portion 108. The gate electrode structure 105 further comprises a gate insulation layer 107 separating the gate electrode structure 105 from a channel region 104, which, in turn, laterally separates appropriately doped source and drain regions 111 having formed therein metal silicide regions 112. A spacer element 110 is formed adjacent the sidewalls of the gate electrode structure 105 and is separated therefrom by a liner 109, which is also formed between the source and drain regions 111 and the spacer element 110. In some cases, the liner 109 may be omitted.

The second transistor 100p may have substantially the same configuration and the same components, wherein the channel region 104 and the drain and source regions 111 include different dopants compared to the respective regions of the transistor 100n.

A typical process flow for forming the semiconductor device 150 as shown in FIG. 1a may comprise the following processes. The substrate 101, the insulating layer 102 and the silicon layer 103 may be formed by advanced wafer bond techniques when the semiconductor device 150 is to represent an SOI device, or the substrate 101 may be provided without the insulating layer 102, as a bulk semiconductor substrate, wherein the silicon layer 103 may represent an upper portion of the substrate, or may be formed by epitaxial growth techniques. Thereafter, the gate insulation layer 107 may be deposited and/or formed by oxidation in accordance with well-established process techniques followed by the deposition of polysilicon by means of low pressure chemical vapor deposition (CVD). Thereafter, the polysilicon and the gate insulation layer 107 may be patterned by sophisticated photolithography and etch techniques in accordance with well-established process recipes. Next, implantation cycles in combination with the manufacturing process for forming the spacer element 110 may be performed, wherein the spacer element 110 may be formed as two or more different spacer elements with intermediate implantation processes when a sophisticated laterally profiled dopant concentration is required for the drain and source regions 111. For example, extension regions 114 of reduced penetration depth may be required. After any anneal cycles for activating and partially curing implantation-induced crystal damage, the metal silicide regions 108 and 112 are formed by depositing a refractory metal and initiating a chemical reaction with the underlying silicon, wherein the spacer element 110 acts as a reaction mask for preventing or reducing the formation of the metal compound between the gate electrode structure 105 and the drain and source regions 111.

FIG. 1b schematically shows the semiconductor device 150 with an etch stop layer 116 and a liner 117 formed above the transistor elements 100n and 100p. Typically, the transistor elements 100n, 100p are embedded in an interlayer dielectric material (not shown in FIG. 1B) over which corresponding metallization layers are to be formed to establish the required electrical connections between the individual circuit elements. The interlayer dielectric material has to be patterned to provide contacts to the gate electrode structure 105 and the drain and source regions 111 by means of an anisotropic etch process. Since this anisotropic etch process has to be performed to different depths, a reliable etch stop layer is provided to prevent a material removal at the gate electrode structure 105 when the etch front has reached the gate electrode structure 105 and still continues to approach the drain and source regions 111. Frequently, the interlayer dielectric material is comprised of silicon dioxide and thus the etch stop layer 116 may comprise silicon nitride, as silicon nitride exhibits a good etch selectivity for well-established anisotropic process recipes for etching silicon dioxide. In particular, silicon nitride may be deposited in accordance with well-established deposition recipes, wherein the deposition parameters may be adjusted to provide a specified intrinsic mechanical stress while at the same time still maintaining the desired high etch selectivity to silicon dioxide. Typically, silicon nitride is deposited by plasma enhanced chemical vapor deposition (PECVD), wherein, for example, parameters of the plasma atmosphere, such as the bias power supplied to the plasma atmosphere, may be varied to adjust the mechanical stress created in the silicon nitride layer as deposited. For example, the deposition may be performed by well-established process recipes on the basis of silane ($SiH_4$) and ammonia ($NH_3$), nitrogen oxide ($N_2O$) or nitrogen ($N_2$) in a deposition tool for PECVD for a silicon nitride layer. The stress in the silicon nitride layer may be determined by the deposition conditions, wherein, for instance, a compressive stress in silicon nitride of up to approximately 1 GPa (GigaPascal) may be obtained with a moderately high bias power according to well-established deposition recipes, while in other embodiments a tensile stress of up to approximately 1 GPa may be achieved by reducing the ion bombardment caused by the bias power in the deposition atmosphere.

Hence, in a conventional approach, the etch stop layer 116 is deposited as a silicon nitride layer having a specified compressive stress. Thereafter, the liner 117 is deposited as a silicon dioxide layer by well-established PECVD techniques.

FIG. 1c schematically shows the semiconductor device 150 with a resist mask 140 formed above the transistor element 100n, 100p to cover the transistor 100p and to expose the transistor 100n. Moreover, the semiconductor device 150 is subjected to an etch process 160 for removing those portions of the etch stop layer 116 and the liner 117 that are not covered by the resist mask 140. For example, the etch process 160 may comprise a first etch step for removing silicon dioxide followed by an etch step to remove silicon nitride. During the etch process 160, the metal silicide portions 108, 112 are exposed to the reactive etch atmosphere, which may result in damage and/or material removal from these regions. Moreover, the regions 108, 112 may also be exposed to a reactive ambience during subsequent clean processes as are typically performed prior to the further processing of the device 150.

FIG. 1d schematically shows the semiconductor device 150 in a further advanced manufacturing stage, wherein a second etch stop layer 119 comprised of silicon nitride and having intrinsic tensile stress is formed above the transistor elements 100n, 100p. Moreover, a further resist mask 170 is formed above the device 150 to expose the transistor 100p while covering the transistor 100n. Furthermore, the device 150 is subjected to an etch process 180 for removing the exposed portion of the second etch stop layer 119 and the remaining liner 117.

Consequently, after completion of the above-described process flow, the transistor 100p comprises an etch stop layer having intrinsic compressive stress that induces a respective compressive strain within the channel region 104, while the transistor 100n has formed thereon the etch stop layer 119 having the intrinsic tensile stress, thereby creating tensile strain in the respective channel region 104. However, owing to the etch process 160 and any further cleaning processes performed after the etch process 160, a significant degradation of the regions 108, 112 of the transistor 100n may have resulted and thus may significantly deteriorate the overall performance of the transistor 100n, thereby partially offsetting the advantages achieved by the enhanced strain engineering described above.

In view of the above-described situation, there exists a need for an alternative technique that enables the creation of different strain in different transistor elements while substantially avoiding or at least reducing at least some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the creation of a desired strain within the channel regions of transistor elements by providing different types of stress-inducing etch stop layers above the respective transistor elements. Hereby, the etch stop layers are separated from the respective transistor structures by a thin liner or etch stop layer, thereby avoiding or at least significantly reducing damages at the transistor structures during the formation of the different types of etch stop layers.

According to one illustrative embodiment of the present invention, a method comprises forming a first etch stop layer over a first transistor element and a second transistor element and forming a second etch stop layer above the first etch stop layer, wherein the second etch stop layer has a first specified intrinsic stress. Moreover, a mask layer is formed above the first and second transistor elements to expose the first transistor element and cover the second transistor element. Thereafter, a first portion of the second etch stop layer formed above the first transistor element is removed by a selective etch process in which the first etch stop layer is used as an etch stop. Finally, a third etch stop layer is formed above the first and second transistor elements, wherein the third etch stop layer has a second intrinsic stress that differs from the first intrinsic stress.

According to another illustrative embodiment of the present invention, a semiconductor device comprises a first transistor element having a first channel region and a first dielectric layer stack enclosing the first transistor element. The first dielectric layer stack comprises a first etch stop layer, a second etch stop layer and an interlayer dielectric, wherein the first dielectric layer stack induces a first strain in the first channel region. The semiconductor device further comprises a second transistor element having a second channel region and a second dielectric layer stack. The second dielectric layer stack encloses the second transistor element and comprises the first etch stop layer, a third etch stop layer and the interlayer dielectric, wherein the second dielectric layer stack induces a second strain in the second channel region. Hereby, the second strain differs from the first strain.

BRIEF DESCRIPTION OF THE DRAWINGS

The invention may be understood by reference to the following description taken in conjunction with the accompanying drawings, in which like reference numerals identify like elements, and in which:

FIGS. 1a-1d schematically show cross-sectional views of a typical conventional semiconductor device including a complementary transistor pair during various manufacturing stages, wherein the strain in the respective channel regions is generated differently by forming respective contact etch stop layers having different intrinsic stress; and FIGS. 2a-2e schematically show cross-sectional views of a semiconductor device including two transistor elements at various manufacturing stages, wherein differently strained channel regions are formed without undue damage of metal silicide regions in accordance with illustrative embodiments of the present invention.

Figure 1A:
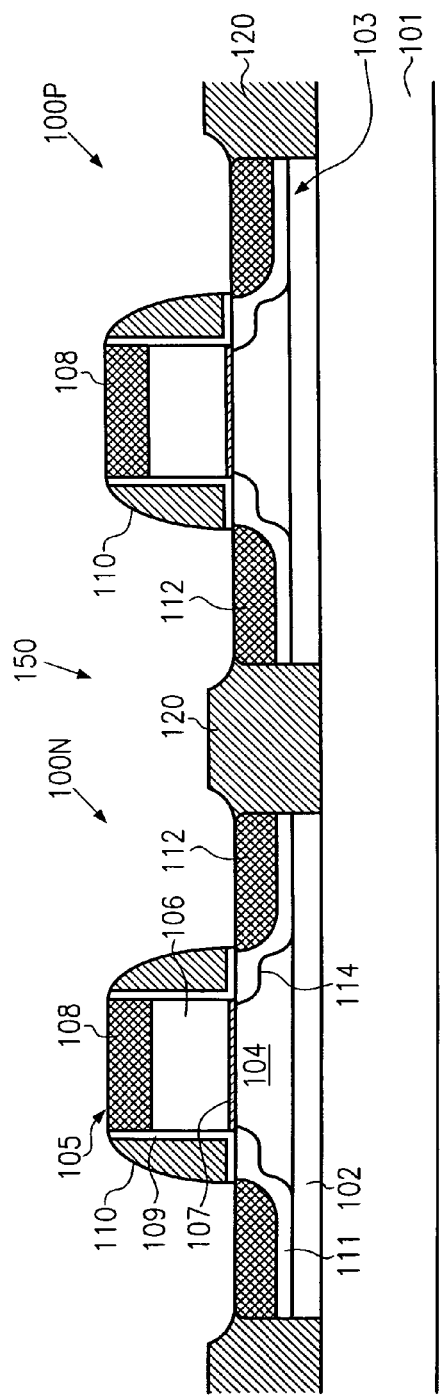

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that an effective strain engineering in the channel region of different transistor types, by providing differently stressed contact etch stop layers, may significantly be improved by providing a thin liner or etch stop layer prior to forming a first portion of the actual contact etch stop layer. In this way, undue damage of metal silicide regions of one transistor, such as an NMOS transistor in the conventional approach as previously described, may be reduced or substantially completely avoided. Moreover, the material composition of the liner or etch stop layer and the actual contact etch stop layer may be selected to achieve a high etch selectivity between the contact etch stop layer and the underlying liner or etch stop layer, thereby requiring a small layer thickness of the liner compared to the layer thickness of the actual contact etch stop layer. Consequently, the stress transfer from the contact etch stop layer to the channel region to create strain therein is only insignificantly affected by the provision of the additional liner. Hence, the stress and thus the strain created within different types of transistor structures may efficiently be controlled without undue degradation of other device features, such as the contact resistance of contact portions of the transistor structures.

Figure 2A:
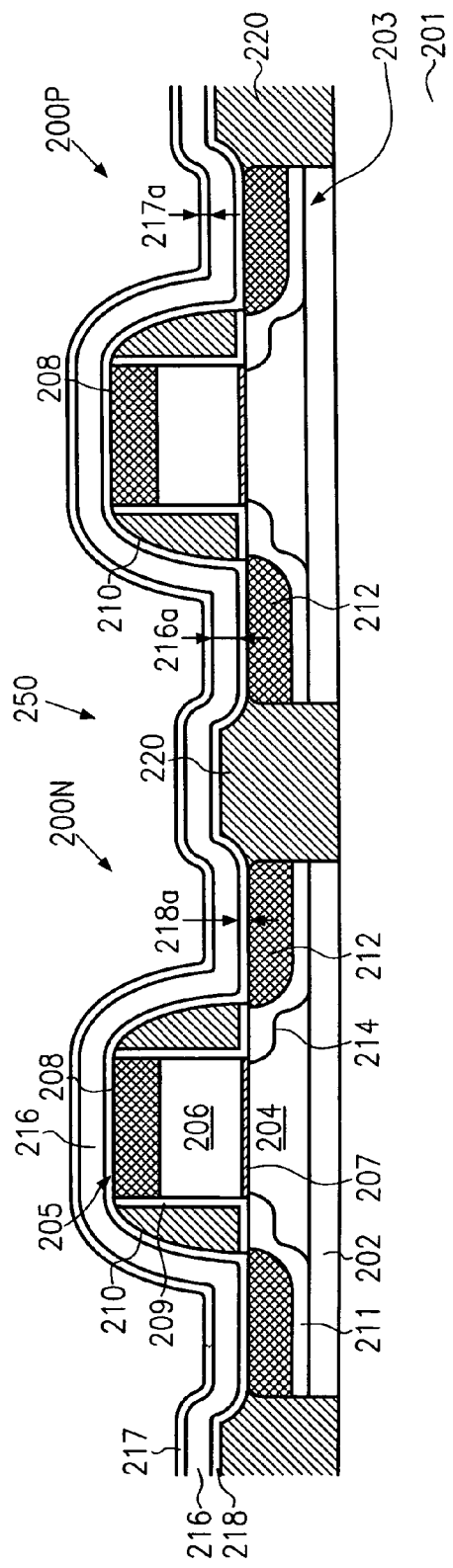

With reference to FIGS. 2a-2e, further illustrative embodiments of the present invention will now be described in more detail. FIG. 2a schematically shows a cross-sectional view of a semiconductor device 250 comprising a first transistor element 200n and a second transistor element 200p. The transistor elements 200n, 200p may represent different types of transistor elements, such as an N-channel transistor and a P-channel transistor, or transistors of the same or different types located at very different die locations or substrate locations and, in particular embodiments, the transistor 200n may represent an N-channel transistor and the second transistor element 200p may represent a P-channel transistor that may be arranged to form a complementary transistor pair. Although the transistors 200n and 200p may differ from each other in size, conductivity type, location, function and the like, for convenience, the transistors shown have substantially the same configuration, and hence corresponding components of the transistors 200n, 200p are denoted by the same reference numerals. It should also be noted that, although the present invention is particularly advantageous for transistor elements without any additional stress inducing components, such as additional epitaxy layers formed in or below the respective channel regions, the present invention may also be combined with such additional strain-creating techniques. It should also be appreciated that in the following description of further illustrative embodiments of the present invention it is referred to transistor elements provided in the form of SOI devices without any raised drain and source regions. As will become clear in the course of the description, the present invention may also be applied to transistor elements formed on semi-conductive bulk substrates and may also readily be applied to transistor designs using raised drain and source regions.

The semiconductor device 250 comprises a substrate 201 having formed thereon an insulating layer 202, such as a buried silicon dioxide layer, silicon nitride layer and the like, followed by a crystalline semiconductor layer 203 (or active layer), which will be referred to as silicon layer in the following description, since the vast majority of integrated circuits including complex logic circuitry is based on silicon. It should be appreciated, however, that the semiconductor layer 203 may be comprised of any appropriate semiconductor material in accordance with design requirements. Also, the substrate 201 may represent a bulk substrate without the insulating layer 202. The first and second transistors 200n, 200p may be separated from each other by an isolation structure 220, which may be provided, for instance, in the form of a shallow trench isolation. The first and second transistors 200n, 200p further comprise a gate electrode structure 205 including a semiconductor portion 206, such as a polysilicon portion, and a metal-containing portion 208 that is provided, for instance, in the form of a metal silicide. The gate electrode structure 205 further comprises a gate insulation layer 207 separating the gate electrode structure 205 from a channel region 204, which in turn laterally separates appropriately doped source and drain regions 211 with corresponding extension regions 214 and having formed therein metal silicide regions 212. A spacer element 210 is formed adjacent to the sidewalls of the gate electrode structure 205 and may be separated therefrom by a liner 209.

The second transistor 200p may have substantially the same configuration, wherein the channel region 204 and the drain and source regions 211 may include different dopants compared to the respective regions of the transistor 200n, when the first and second transistors 200n, 200p represent transistor elements of a different conductivity type.

Moreover, the semiconductor device 250 comprises a first liner or etch stop layer 218 and a second or contact etch stop layer 216 formed above the first etch stop layer 218. In illustrative embodiments, the contact etch stop layer 216 is formed on the first etch stop layer 218, wherein the layers 216, 218 are formed of different materials to exhibit a desired degree of etch selectivity with respect to an etch process that will be described later on. In one embodiment, the first etch stop layer 218 may be comprised of silicon dioxide, whereas the contact etch stop layer 216 may be comprised of silicon nitride. Moreover, the contact etch stop layer 216 has a specified intrinsic stress, which is appropriately selected to create a desired degree of strain within one of the channel regions 204 of the first and second transistors 200n, 200p. For example, the contact etch stop layer 216 may have a specified compressive stress, when one of the transistors 200n, 200p is to receive a compressively strained channel region 204. In the embodiment shown, the transistor 200p may represent a P-channel transistor whose channel region 204 is to receive a compressive strain to enhance the hole mobility therein. It should be appreciated that a thickness 218a of the first etch stop layer 218 is less than a thickness 216a of the contact etch stop layer 216 so that the stress transfer mechanism is substantially not affected by the presence of the first etch stop layer 218. For example, the thickness 218a may range from approximately 5-25 nm, whereas the thickness 216a may range from approximately 20-80 nm for highly scaled semiconductor devices having a gate length, that is in FIG. 2a the horizontal extension of the gate electrode 206, of approximately 100 nm and less. In particular embodiments, the gate length of the transistors 200n and/or 200p may be approximately 50 nm or even less. Regarding the material composition of the layers 216, 218, it should be appreciated that other appropriate materials may be used, as long as a desired etch selectivity between the layers 216, 218 is achieved. For instance, amorphous carbon, silicon carbide, and the like may be used in combination with silicon dioxide and/or silicon nitride in conformity with device requirements.

In one illustrative embodiment, a further etch stop layer 217 is provided above the contact etch stop layer 216, wherein the etch stop layer 217 is comprised of a material exhibiting a desired high etch selectivity to the contact etch stop layer 216. In illustrative embodiments, the layers 217, 218 may be comprised of substantially the same material, for instance silicon dioxide, silicon nitride and the like, as long as a desired high etch selectivity to the contact etch stop layer is achieved. A thickness 217a of the layer 217 may be selected to be significantly less than the thickness 216a.

Figure 1B:
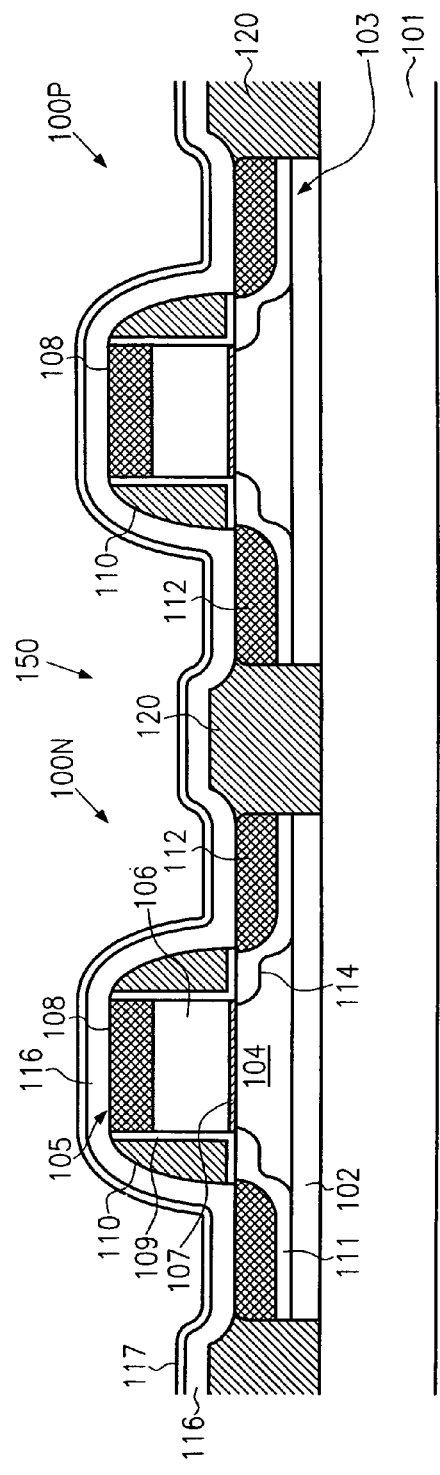

A typical process flow for forming the semiconductor device 250 as shown in FIG. 2a may comprise the following processes. The substrate 201 and the transistors 200n, 200p may be formed according to similar processes as are previously described with respect to the device 150 described with reference to FIG. 1a. Thereafter, the first etch stop layer 218 may be formed by depositing an appropriate material, such as silicon dioxide, in accordance with well-established deposition techniques, such as plasma enhanced CVD. Next, the contact etch stop layer 216 may be deposited, for instance in the form of a silicon nitride layer, as it is also described with reference to FIG. 1b for the layer 116. In particular, the intrinsic stress of the layer 216, when provided in the form of a silicon nitride layer, may be adjusted by controlling one or more of the deposition parameters, such as the gas mixture, the deposition rate, the temperature and the ion bombardment, during the deposition process in accordance with known techniques. The term "intrinsic stress" is to be understood as specifying a certain type of stress, that is tensile or compressive, or any variation thereof, i.e., orientation dependent tensile or compressive stress, as well as the magnitude of the stress. For example, compressive stress within the silicon nitride may be obtained by using a moderately high bias power, thereby providing a high degree of ion bombardment during the deposition. To create a desired ion bombardment, dual frequency CVD reactors are usually used to adjust a desired amount of bias power by correspondingly controlling the low frequency power provided by the dual frequency reactor. For example, if the low frequency supply is significantly reduced or turned off, a silicon nitride layer having a tensile stress is created. On the other hand, a moderately high bias power creates compressive stress in the silicon nitride layer. Thus, in illustrative embodiments, the layer 216 may have an intrinsic tensile or compressive stress with a magnitude of approximately 0.0-1.0 GPa (Giga-Pascal). An appropriate deposition process for forming the contact etch stop layer 216 may be performed with any deposition tool that enables the creation of an appropriate plasma atmosphere. Thereafter, the etch stop layer 217 may be deposited, in one illustrative embodiment, in the form of a silicon dioxide layer by well-established processes.

Figure 2B:
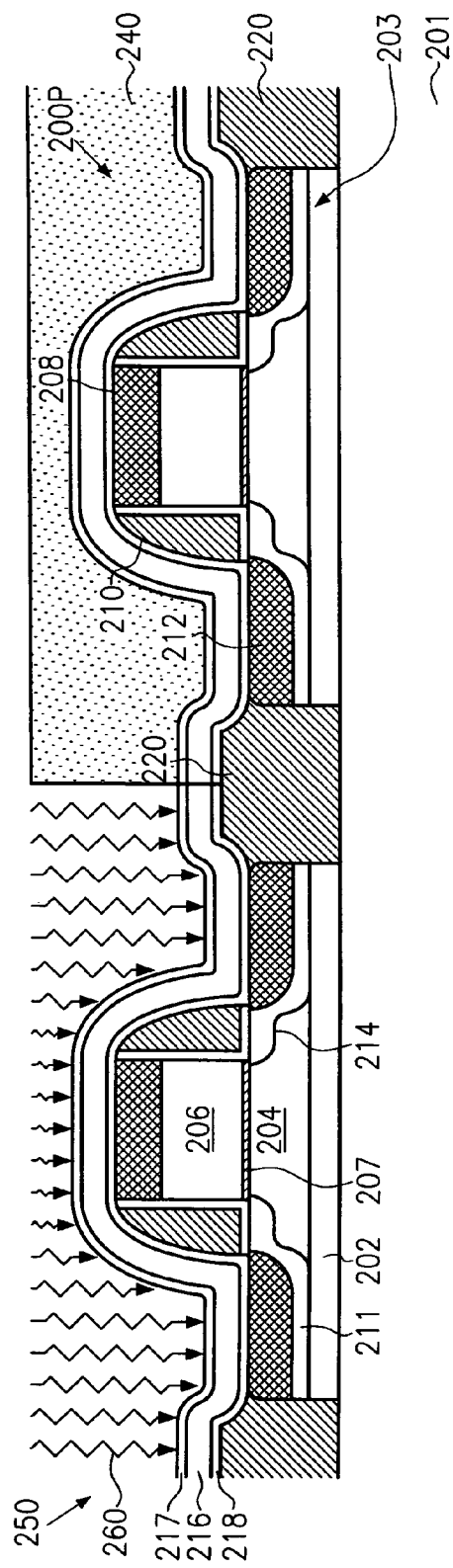

FIG. 2b schematically shows the device 250 with a resist mask 240 formed thereon, wherein the resist mask 240 covers the second transistor 200p while exposing the first transistor 200n and the corresponding portions of the layers 218, 216, 217. Moreover, the device 250 is shown to be subjected to an etch process 260 for removing the exposed portions of the layers 217, 216. The etch process 260 may comprise a first etch step to etch through the etch stop layer 217, for instance on the basis of a wet chemical process, for instance with diluted fluoric acid, or on the basis of a plasma etch process, whose etch chemistry is designed to remove the layer 217. Hereby, an etch selectivity for this etch chemistry to the underlying contact etch stop layer 216 may not be critical, since the thickness 217a may be significantly less than the thickness 216a so that typically the first etch step of the process 260 may reliably be stopped within the layer 216 prior to reaching the first etch stop layer 218. In other embodiments, the first etch step may be a selective etch step to remove the exposed portion of the layer 217 substantially without removing material of the layer 216.

Thereafter, a second etch step of the process 260 may be performed, which uses an etch chemistry that takes advantage of the different material composition of the layers 218, 216. Corresponding selective etch chemistries are well known in the art and are, for instance, well established for silicon nitride and silicon dioxide. Consequently, the exposed portion of the contact etch stop layer 216 may reliably be removed, since the etch front is stopped on or within the first etch stop layer 218, thereby reducing or substantially completely avoiding any interaction of the etch front with the metal silicide regions 208, 212.

FIG. 2c schematically shows the semiconductor device 250 after completion of the etch process 260 and after the removal of the resist mask 240 and any cleaning processes. Hence, the device 250 comprises the first etch stop layer 218 above the first transistor 200n, possibly slightly damaged by the preceding etch process 260 and any cleaning processes, thereby still providing an efficient protection of the underlying metal silicide regions 208, 212. On the other hand, the second transistor 200p comprises the remaining portion of the contact etch stop layer 216 having the first intrinsic stress and formed thereabove the remaining portion of the etch stop layer 217.

It should be appreciated that, in other embodiments, the etch stop layer 217 (FIGS. 2a and 2b) may be omitted during the preceding process steps described with reference to FIGS. 2a and 2b, and may be formed on the device 250 as shown in FIG. 2c, thereby recovering the slightly damaged layer 218 above the first transistor 200n, which may result in an increased thickness compared to the layer portion that will be formed in this alternative above the second transistor 200p. For the further description it is, however, assumed that the etch stop layer 217 has been formed as is described with reference to FIGS. 2a and 2b.

FIG. 2d schematically shows the device 250 having formed thereon a second contact etch stop layer 219 with a second intrinsic stress. The second contact etch stop layer 219 may be comprised of the same material as the contact etch stop layer 216, although deposited under different conditions to achieve the desired different intrinsic stress, thereby providing substantially the same etch stop characteristics in a contact etch process to be performed later on. In other embodiments, the contact etch stop layers 216, 219 may differ in their material composition as long as a similar etch selectivity with respect to an interlayer dielectric material to be deposited above the layers 219, 216 is maintained. Moreover, the device 250 is shown with a resist mask 270, which is designed to cover the first transistor 200n and expose the second transistor 200p, and of course the respective layers 219, 217, 216, 218 formed thereabove. Furthermore, the device 250 is subjected to an etch process 280 designed to remove that portion of the contact etch stop layer 219 that is not covered by the resist mask 270.

The second contact etch stop layer 219 may be formed in accordance with well-established process recipes and may, in particular embodiments, be formed as a silicon nitride layer on the basis of a process recipe to achieve the desired degree of intrinsic stress. For instance, the layer 219 may be deposited with a reduced compressive stress compared to the layer 216, which may be advantageous in adapting the electron mobility of the transistor 200n, if provided as an N-channel transistor, to the hole mobility of the transistor 200p, if provided as a P-channel transistor. In one illustrative embodiment, the layer 219 may be deposited with a specific tensile stress as is required for creating a desired tensile strain within the channel region 204 of the first transistor 200n. It should be appreciated that, in the process sequence described so far, the layers 216, 219 may exhibit any desired degree of intrinsic stress to account for specific process requirements. For instance, the transistors 200n, 200p may represent transistors at very different die locations or even in different die on an individual substrate 201, wherein the different degrees of intrinsic stress in the layers 216, 219 may be used to compensate for process non-uniformities occurring during the formation of the transistors 200n, 200p. Moreover, as may be appreciated, the layer 219 may be formed prior to the layer 216 and the masks 270, 240 may be provided in a reversed sequence to first form the layer 219 above the transistor 200n and subsequently provide the layer 216 above the transistor 200p.

After the deposition of the contact etch stop layer 219 and the formation of the resist mask 270, the etch process 280 may be performed, wherein in one embodiment, the process is designed to exhibit a moderately high etch selectivity with respect to the etch stop layer 217. In this case, the etch front of the process 280 is reliably stopped on or within the layer 217, without unduly affecting the contact etch stop layer 216 having the first intrinsic stress. After removal of the exposed portion of the layer 219, in some embodiments, the etch stop layer 217 may be removed, whereas, in other embodiments, the layer 217 may be maintained, since the layer 217 may have substantially the same material composition as an interlayer dielectric to be deposited on the device 250.

Figure 2E:
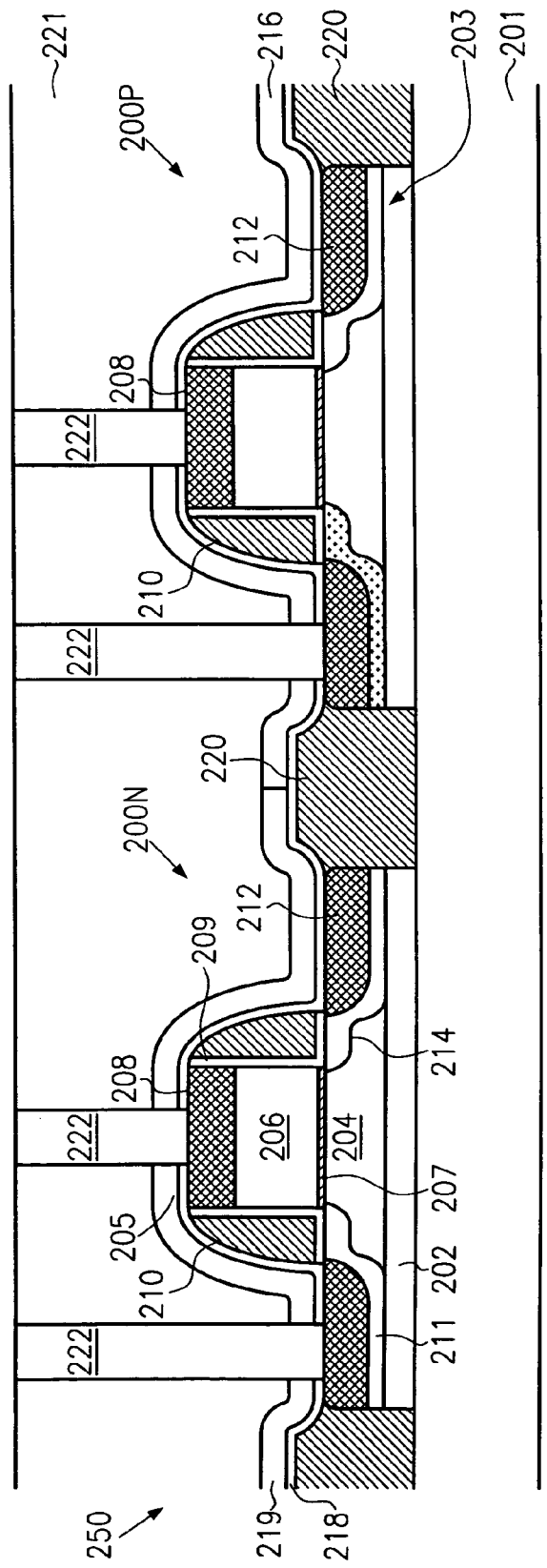

FIG. 2e schematically shows the device 250 with an interlayer dielectric 221 formed above the contact etch stop layers 216, 219 and with contact portions 222 formed in the interlayer dielectric 221 and the contact etch stop layers 219, 216 and the etch stop layer 218.

A typical process flow for forming the device as shown in FIG. 2e may comprise the following processes. The interlayer dielectric 221 may be deposited in the form of silicon dioxide on the basis of deposition techniques, such as PECVD from TEOS and/or sub-atmospheric CVD on the basis of TEOS and/or high density plasma enhanced CVD to form a silicon dioxide layer reliably enclosing the first and second transistors 200n, 200p. Thereafter, the surface of the interlayer dielectric 221 may be planarized, for instance, by chemical mechanical polishing and corresponding contact openings may be etched on the basis of well-established etch recipes. For this purpose, a selective anisotropic etch chemistry may be used to etch through the interlayer dielectric 221 on the basis of a correspondingly designed resist mask (not shown), wherein the contact etch stop layer 219 for the transistor 200n and the contact etch stop layer 216 for the transistor 200p reliably stop the etch front at the gate electrodes 205, while the etch process continues until the etch front reaches the corresponding contact etch stop layers above the drain and/or source regions 211. Thereafter, the etch chemistry may be changed to exhibit a high removal rate for the materials of the contact etch stop layers 219, 216, wherein not necessarily a high degree of selectivity to the underlying etch stop layer 218 may be necessary. That is, the contact etch stop layers 219, 216 may be opened selectively to the etch stop layer 218, which in turn is then appropriately etched with a modified etch chemistry, thereby causing minimal damage at the underlying metal silicide regions 208, 212. In other embodiments, the layers 219, 216 and the etch stop layer 218 may be opened by a common etch process, since an end point of this etch process may be detected without undue material removal of the regions 208, 212 as the combined layer thickness of the layers 219, 216, on the one hand, and the layer 218 is small enough to provide a substantially uniform etch behavior. After completion of the etch process, the openings may be filled with an appropriate conductive material on the basis of well-established process recipes.

As a result, the present invention provides a technique that enables the efficient creation of different types of strain in channel regions of different transistor elements, while substantially avoiding or at least significantly reducing inadvertent effects on the metal silicide regions of the transistors, by providing a corresponding etch stop layer prior to the formation of the strain inducing layers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first etch stop layer above a first transistor element and a second transistor element;
   forming a second etch stop layer above said first etch stop layer, said second etch stop layer having a first specified intrinsic stress;
   forming a third etch stop layer above said second etch stop layer,
   forming a first mask layer above said first and second transistor elements to expose said first transistor element and cover said second transistor element;
   removing a first portion of said second and third etch stop layers formed above said first transistor element by a selective etch process using said first etch stop layer as an etch stop; and
   forming a fourth etch stop layer above said first and second transistor elements, said fourth etch stop layer having a second intrinsic stress that differs from said first intrinsic stress.

2. The method of claim 1, wherein said fourth etch stop layer is formed prior to forming said mask layer.

3. The method of claim 1, further comprising forming a second mask layer above said first and second transistor elements to cover said first transistor element and expose said second transistor element.

4. The method of claim 3, further comprising removing a portion of said fourth etch stop layer formed above said second transistor element by a selective etch process using said third etch stop layer as an etch stop.

5. The method of claim 4, further comprising selectively removing a portion of said third etch stop layer formed above said second transistor element.

6. The method of claim 5, further comprising depositing an interlayer dielectric material above said first and second transistor elements and forming contact openings in said interlayer dielectric material and said first, second and third etch stop layers.

7. The method of claim 6, wherein forming said contact openings comprises etching through said interlayer dielectric material while using said second and third etch stop layers as an etch stop, etching through said second and third etch stop layers while using said first etch stop layer as an etch stop and etching through said first etch stop layer.

8. The method of claim 1, wherein said first etch stop layer is deposited with a first thickness and said second etch stop layer is deposited with a second thickness, said first thickness being less than said second thickness.

9. The method of claim 1, wherein said third etch stop layer is deposited with a third thickness and said fourth etch stop layer is deposited with a fourth thickness, said fourth thickness being greater than said third thickness.

* * * * *